United States Patent [19]
Yee

[11] Patent Number: 5,508,642
[45] Date of Patent: Apr. 16, 1996

[54] SERIES-GATED EMITTER-COUPLED LOGIC CIRCUIT PROVIDING CLOSELY SPACED OUTPUT VOLTAGES

[75] Inventor: Loren W. Yee, San Francisco, Calif.

[73] Assignee: National Semiconductor Corporation, Santa Clara, Calif.

[21] Appl. No.: 472,071

[22] Filed: Jun. 5, 1995

Related U.S. Application Data

[63] Continuation of Ser. No. 193,318, Feb. 8, 1994, abandoned.
[51] Int. Cl.⁶ .................... H03K 19/086; H03K 19/20
[52] U.S. Cl. .................... 326/126; 326/33; 327/538
[58] Field of Search .................... 307/455, 443, 307/296.6; 326/126, 33, 26; 327/538

[56] References Cited

U.S. PATENT DOCUMENTS

| | | | |
|---|---|---|---|
| 4,145,621 | 3/1979 | Colaco | 326/127 |
| 4,670,673 | 6/1987 | Varadarajan | 307/455 |
| 4,714,841 | 12/1987 | Shoji et al. | 307/455 |
| 4,737,663 | 4/1988 | Varadarajan | 307/455 |
| 4,751,404 | 6/1988 | Yuen | 307/297 |
| 5,111,074 | 5/1992 | Gravrok et al. | |
| 5,128,561 | 7/1992 | Montegari | |

OTHER PUBLICATIONS

*F100K ECL Data Book*, Fairchild Camera and Instrument Corp., 1982, pp. 2–5 to 2–10.

*Primary Examiner*—Edward P. Westin
*Assistant Examiner*—Stephen Calogero
*Attorney, Agent, or Firm*—Skjerven, Morrill, MacPherson, Franklin & Friel; David E. Steuber

[57] ABSTRACT

An emitter-coupled logic circuit provides differential outputs which are delivered to pairs of transistors in emitter-coupled logic (ECL) switches. The differential outputs allow additional ECL switches to be connected between a positive and negative supply voltage. A unique current source for the ECL switches includes diodes and/or transistors connected in parallel with the ECL switches such that the supply current is relatively independent of fluctuations in the supply voltage and yet the voltage drop across the current source is minimized.

21 Claims, 4 Drawing Sheets

SERIES-GATED EMITTER-COUPLED LOGIC CIRCUIT PROVIDING CLOSELY SPACED OUTPUT VOLTAGES

This application is a continuation of application Ser. No. 08/193,318, filed Feb. 8, 1994, now abandoned.

FIELD OF THE INVENTION

This invention relates to emitter-coupled logic circuits and, in particular, an improved series-gated emitter-coupled logic circuit which permits a greater number of decision-making levels to be connected between the positive and negative supply voltages.

BACKGROUND OF THE INVENTION

Emitter-coupled logic circuits generally operate by switching currents between two parallel current paths. A switching transistor is connected in each of the parallel paths, and the emitters of the transistors are coupled together. A basic current-mode logic (CML) switch 10 is illustrated in FIG. 1. The switch is connected between a positive supply voltage $V_{CC}$ and a negative supply voltage $V_{EE}$. A current source CS supplies a constant current $I_S$. In the normal arrangement, $V_{BB}$ is a reference voltage which is applied to the base of a transistor Q2 and the input voltage $V_{IN}$ is applied to the base of a transistor Q1. $V_{BB}$ is set at a point halfway between the high and low states of the input voltage $V_{IN}$. Thus, when $V_{IN}$ is high, transistor Q1 conducts and a voltage drop across a load resistor R1 causes the output $V_{C1}$ to go low. Conversely, when $V_{IN}$ is low, transistor Q2 conducts and the output voltage $V_{C1}$ goes high.

The output voltage $V_{C2}$ is the inverse of $V_{C1}$. That is, when $V_{IN}$ is high, the output $V_{C2}$ is high; when $V_{IN}$ is low, the output $V_{C2}$ is low.

The minimum voltage swing between the high and low states of $V_{IN}$ necessary to switch the current completely between transistors Q1 and Q2 is about 250 mV, centered about $V_{BB}$. Alternatively, transistors Q1 and Q2 can be driven differentially with a smaller voltage swing (e.g., 150 mV). Normally, the input signal swing is made considerably larger (approximately 600–750 mV for a single-ended input and 300–350 mV for differential inputs) to provide noise immunity and to allow for variations in the output voltage levels in the CML switches connected into a given logic network. In FIG. 1, VC1 ranges from $V_{CC}$ (typically ground) when transistor Q1 is turned off to approximately –0.35 V when Q1 is conducting the current $I_S$ (i.e., $I_S \times R1 = 0.35$ V).

A conventional buffered emitter-coupled logic (ECL) circuit 20 is illustrated in FIG. 2. To avoid transistor saturation and accommodate large voltage swings, as well as to increase the interconnect driving capabilities, emitter followers Q3 and Q4 have been added. The emitter followers Q3 and Q4 have their collectors connected to a separate positive supply voltage $V_{CCA}$ to ensure that any changes in load currents during switching do not cause a change in $V_{CC}$ through the small but finite inductance of the $V_{CCA}$ bond wire and package lead. Outside the package, the $V_{CC}$ and $V_{CCA}$ leads are normally connected to a common $V_{CC}$ distribution. Thus, the voltages at the emitters of emitter followers Q3 and Q4 are approximately one diode drop ($\phi$) below the output voltages $V_{C1}$ and $V_{C2}$. Since R1= R2, $I_S \times R1 = I_S \times R2$, which is equal to about 750 mV. Assuming that 750 mV $\approx \phi$, the output voltages $V'_{C1}$ and $V'_{C2}$ vary between a high state of about $-\phi$ and a low state of about $-2\phi$.

FIGS. 1 and 2 show a single level of decision-making, represented by the conductive state of the transistor pair Q1 and Q2. A series of decision-making levels can be used to perform AND and NAND logic functions. FIG. 3 illustrates an AND/NAND logic gate 30, which includes an additional transistor pair consisting of transistors Q5 and Q6. Unless inputs A and B are both high, no current flows through load resistor R1, and a current flows through load resistor R2. If only input A is low, for example, current flows through transistors Q2 and Q5; if only input B is low, a current flows through transistor Q6. Hence, the output $V_{C1}$ is equal to $\overline{AB}$ and the output $V_{C2}$ is equal to AB.

In FIG. 3, assuming that $V_{CC}$ is set at ground, input A would vary between $-\phi$ (high) and $-2\phi$ (low) and reference voltage $V_{BB}$ would be set at approximately $-1.5\phi$. Therefore, in the worst case, the coupled emitters of transistors Q1 and Q2 would be at approximately $-2.5\phi$. The input B must be translated downwards by $\phi$, so that it varies between $-2\phi$ and $-3\phi$, and the reference voltage $V'_{BB}$ is set at about $-2.5\phi$.

The need to translate additional inputs downwards sets a limit on the number of decision-making levels that can be used in a series-gated ECL circuit. For a typical negative supply voltage $V_{EE}$ of $-5.2$ V, the practical limit known in the prior art is three levels. FIG. 4 illustrates a schematic circuit diagram of a generalized three-level ECL circuit 40, transistors Q7 and Q8 representing the third level. As shown, the coupled emitters of transistors Q5 and Q6 are at about $-3.5\phi$ and the additional input C is shifted downward by a transistor Q9 and a diode D1. Thus, input C is translated downward by $2\phi$ so that the voltage at the base of transistor Q7 varies between $-3.0\phi$ (high) and $-4.0\phi$ (low). The third reference voltage $V''_{BB}$ is set at $-3.5\phi$.

FIG. 4 also illustrates that current source CS includes a transistor Q10 and a resistor RCS. The current $I_S$ is determined by an internally generated reference voltage $V_{CS}$, the value of resistor RCS, and the base-emitter voltage of transistor Q10. $V_{CS}$ is designed to remain fixed with respect to the negative supply voltage $V_{EE}$, which makes $I_S$ independent of supply voltage. Regulating the current $I_S$ in this way simplifies system design because the output voltage and switching parameters are not sensitive to changes in $V_{EE}$. Output voltage levels are determined primarily by the voltage drops across load resistors R1 and R2 resulting from the collector currents of transistors Q1 and Q2. Since these collector currents are determined by $I_S$ and the $\alpha$'s of transistors Q1 and Q2, the voltage drops across the load resistors R1 and R2 are relatively insensitive to variations in $V_{EE}$.

Using a current source of this kind creates a voltage drop of approximately $1.5\phi$ between the base of transistor Q10 and the negative supply voltage $V_{EE}$. This is the result of the band gap regulator design. Since the collector of transistor Q10 is at a voltage approximately equal to $-4.5\phi$, the total voltage drop between the positive and negative supply rails is approximately $6\phi$. With a supply voltage of 5.2 V ($V_{EE}= -5.2$ V$\pm 5\%$), which is typical in 10 KH logic, this arrangement limits the number of decision-making levels that can be connected in a series-gated arrangement to a maximum of three.

Since the use of series-gated arrangements greatly enhances logic capability and performance with low device count, it is desirable to increase the permissible number of decision-making levels. This is accomplished in a circuit in accordance with the principles of this invention.

SUMMARY OF THE INVENTION

An emitter-coupled logic (ECL) circuit according to this invention includes a plurality of basic emitter-coupled switches, each switch representing a decision-making level and containing a pair of transistors connected in respective parallel current paths. A unique output circuit provides closely-spaced output voltages.

In the preferred embodiment, a pair of differential inputs are applied to each pair of transistors, with a true input being applied to one transistor of each pair and an inverse input being applied to the other transistor of the pair.

The output circuit provides a plurality of closely-spaced outputs. A PN junction (preferably the base-emitter junction of a transistor) is connected in series with a load resistor. A voltage divider is connected in parallel with this series combination. Outputs may be taken at a point in the series path between the load resistor and the PN junction, an intermediate point in the voltage divider, and at an end of the voltage divider. Additional outputs can be created by adding more PN junctions and voltage dividers. Inverse outputs can be generated by connecting a similar circuit to a second load resistor.

A supply current ($I_S$) source includes a plurality of PN junctions (in the form of diodes and/or transistors) connected serially in a conduction path parallel with the decision-making levels. The series of PN junctions together provide a preselected voltage drop across the decision-making levels and ensure that the supply current is largely independent of variations in the voltage between the positive and negative supply voltages. This arrangement minimizes the voltage drop required by the current source and maximizes the number of levels that may be included between the positive and negative supply voltages. (As used herein, the terms "positive" and "negative" supply voltage express the relative voltage difference between the two supply voltages. Either supply voltage may be positive, negative or grounded in absolute terms.)

In a preferred embodiment, a total of four decision-making levels are provided in an ECL circuit supplied by a voltage difference of only 3.3 V. This invention is not limited to a 3.3 V power supply, however, but may be applied to any supply voltage.

The ECL logic circuit of this invention is preferably formed in an integrated circuit (IC) chip.

DESCRIPTION OF THE INVENTION

Figure 1:
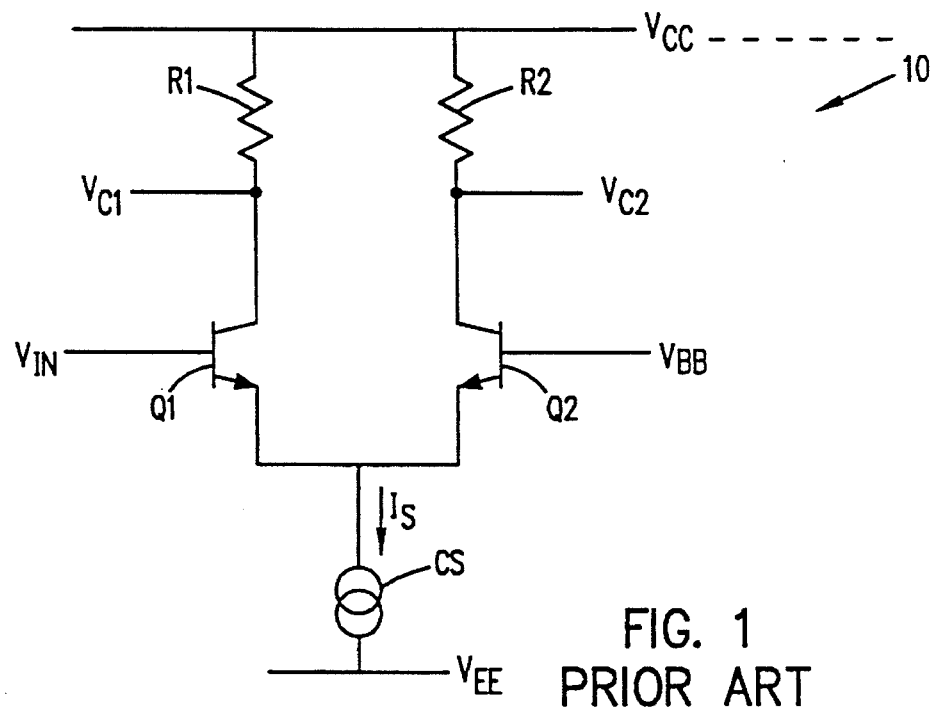
FIG. 1 illustrates a circuit diagram of a basic CML switch.
Figure 2:
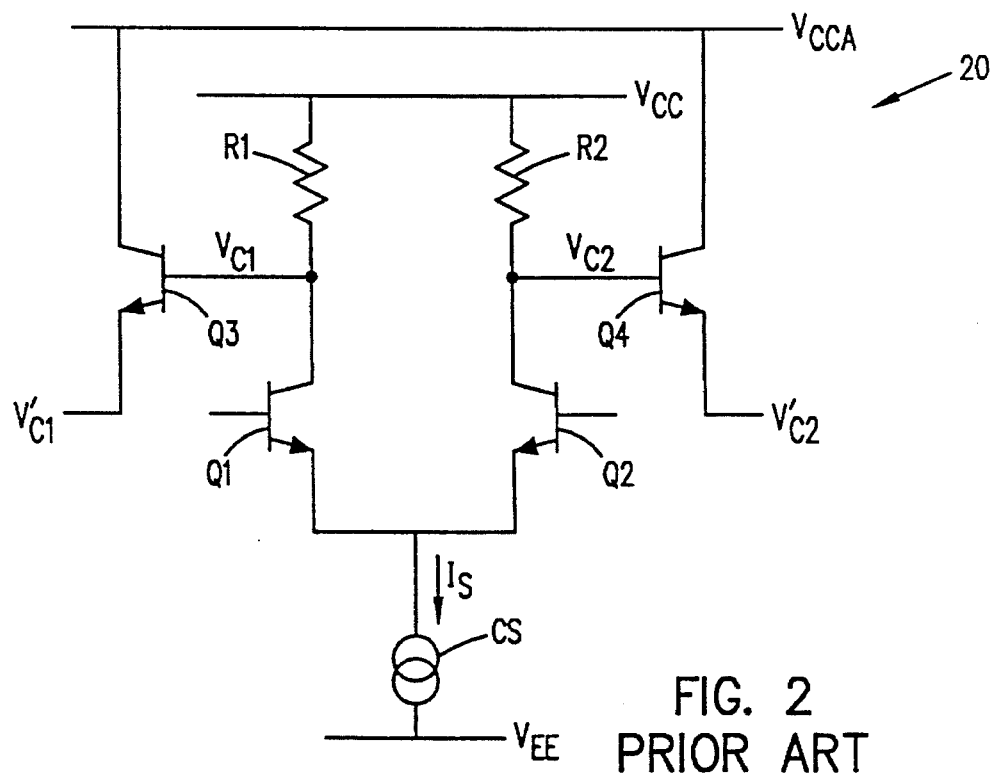
FIG. 2 illustrates a circuit diagram of a buffered ECL circuit.
Figure 3:
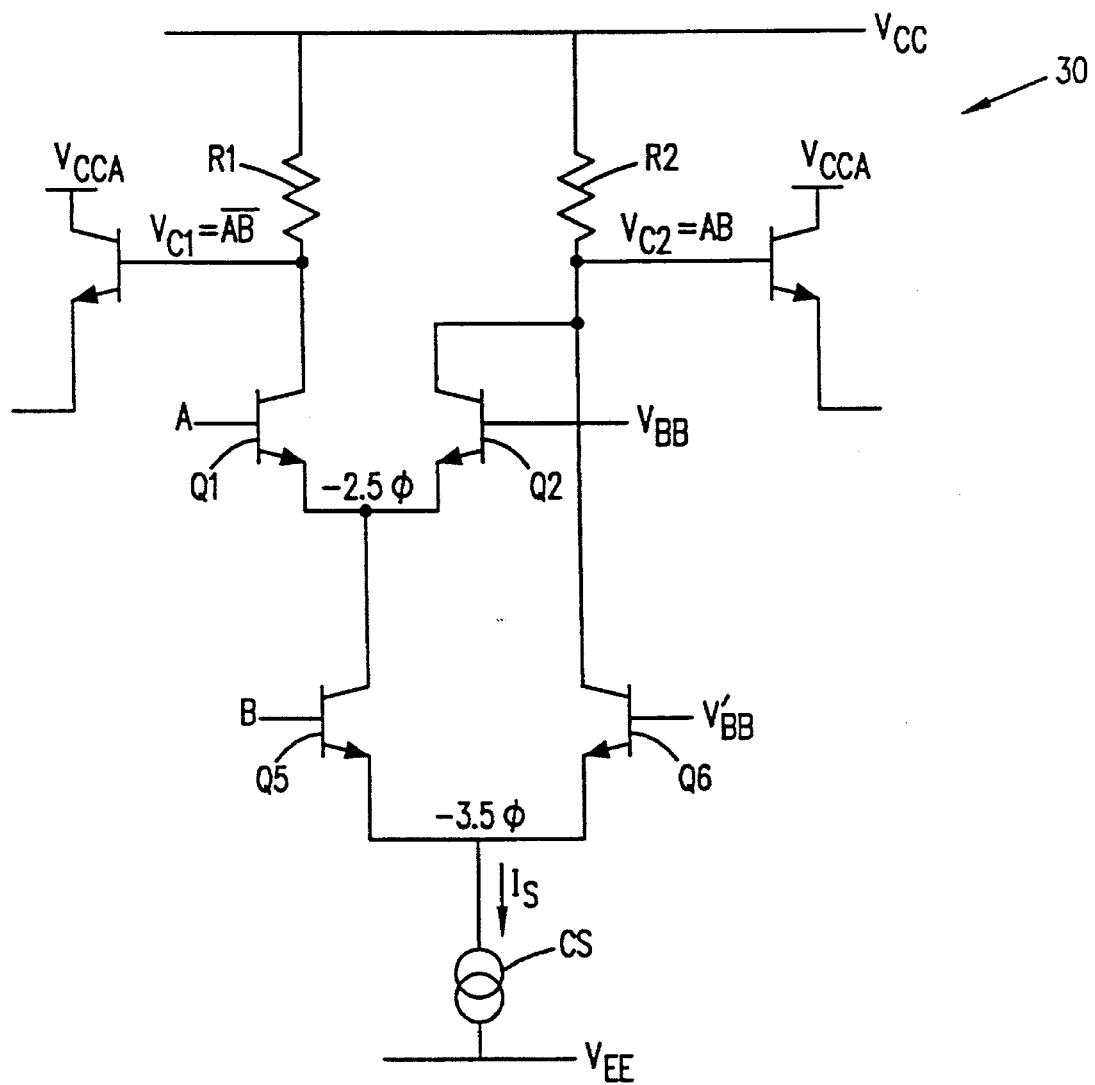
FIG. 3 illustrates a conventional logic circuit configured to perform AND and NAND functions.
Figure 4:
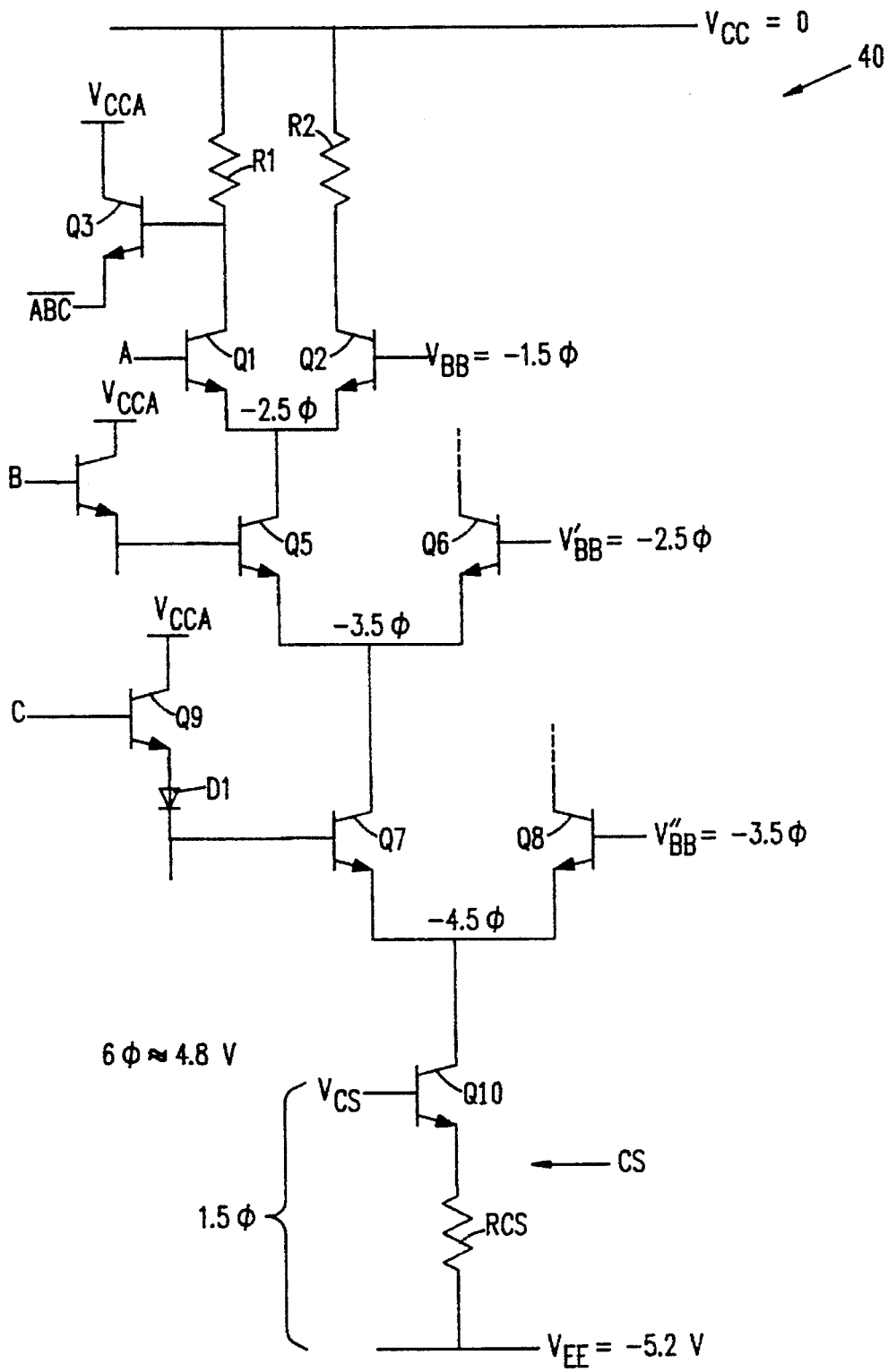
FIG. 4 illustrates a conventional logic circuit which includes three decision-making levels.
Figure 5:
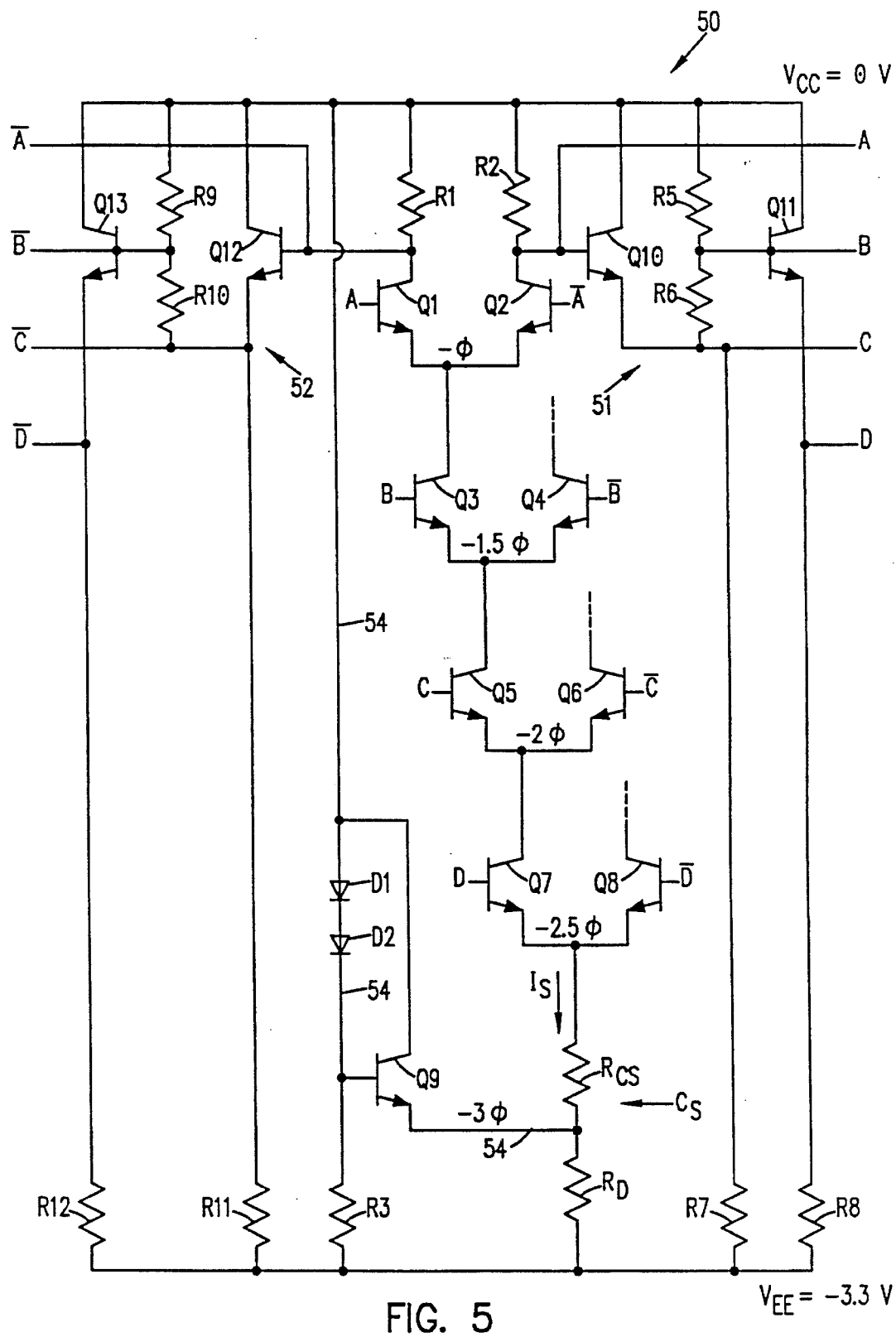
FIG. 5 illustrates an ECL logic circuit in accordance with this invention.

FIG. 5 illustrates an ECL circuit 50 according to the invention which includes four decision-making levels interposed between positive and negative supply rails separated by 3.3 V. In this embodiment, $V_{CC}$ is set at ground and $V_{EE}$ is set at −3.3 V. The four decision-making levels include transistor pairs $Q_1$ and $Q_2$, $Q_3$ and $Q_4$, $Q_5$ and $Q_6$, and $Q_7$ and $Q_8$, respectively. The collector of transistor $Q_3$ is connected to the emitters of paired transistors $Q_1$ and $Q_2$; the collector of transistor $Q_5$ is connected to the emitters of paired transistors $Q_3$ and $Q_4$; etc. The collectors of transistors $Q_2$, $Q_4$, $Q_6$ and $Q_8$ may be connected directly to the positive supply voltage $V_{CC}$ or may be connected to other transistor pairs (not shown) to form a logic circuit in accordance with techniques well known in the art. For example, transistors $Q_2$, $Q_4$, $Q_6$ and $Q_8$ may be connected into an octal decoding tree of the kind illustrated in FIG. 2–7 of the "F100K ECL User's Handbook", Fairchild Camera and Instrument Corporation (1982), which is incorporated herein by reference.

Load resistors $R_1$ and $R_2$ are connected between $V_{CC}$ and the collectors of transistors $Q_1$ and $Q_2$, respectively. A constant current $I_S$ is supplied by a current supply $C_S$ which is connected between the emitters of transistors $Q_7$ and $Q_8$ and the negative supply voltage $V_{EE}$. Resistors $R_1$ and $R_2$ are sized such that the constant current $I_S$ through either of them provides a voltage drop equal to 0.5ϕ (approximately 375 mV). The voltages at various points in the circuit are designated with reference to ground by multiples of a diode voltage drop ϕ. (Each unit ϕ is equal to approximately 750 mV.)

Differential inputs are supplied to the base terminals of transistors $Q_1$ and $Q_2$, $Q_3$ and $Q_4$, $Q_5$ and $Q_6$, and $Q_7$ and $Q_8$. In particular, an input A is supplied to the base of transistor $Q_1$ and an inverse input $\overline{A}$ is supplied to the base of transistor $Q_2$, a second input B is supplied to the base of transistor $Q_3$, and an inverse input $\overline{B}$ is supplied to the base of transistor $Q_4$, etc.

Current supply $C_S$ includes diodes $D_1$ and $D_2$, a transistor $Q_9$, and resistors $R_{CS}$, $R_D$ and $R_3$. (Since ECL circuit 50 is preferably formed in an IC chip, diodes $D_1$ and $D_2$ would actually be transistors with shorted collector-base terminals.) The emitter of transistor $Q_9$ is connected through a resistor $R_{CS}$ to the coupled emitter terminals of transistors $Q_7$ and $Q_8$. The base of transistor $Q_9$ is connected through a resistor $R_3$ to the negative supply voltage $V_{EE}$. Resistor $R_{CS}$ is connected in series with a damping resistor $R_D$ to $V_{EE}$. The combination of diodes $D_1$ and $D_2$ and transistor $Q_9$ yields a voltage of −3ϕ at the common junction of resistors $R_{CS}$ and $R_D$. Each of diodes $D_1$ and $D_2$ and transistor $Q_9$ provides a PN junction which is forward-biased and contributes a single diode voltage drop ϕ when circuit 50 is operative. The PN junctions in diodes $D_1$ and $D_2$ and transistor $Q_9$ are connected serially in a conduction path 54 which is connected in parallel with the four decision-making levels shown in FIG. 5 (represented by transistor pairs $Q_1/Q_2$, $Q_3/Q_4$, $Q_5/Q_6$, $Q_7/Q_8$). Resistor $R_3$ is used to bias diodes $D_1$ and $D_2$.

ECL circuit 50 also includes a true output circuit 51 and an inverse output circuit 52. True output circuit 51 includes a transistor $Q_{10}$ having a base tied to the collector of transistor $Q_2$. Resistors $R_5$ and $R_6$, which are equal, are connected in parallel with the collector-emitter path of transistor $Q_{10}$. The common junction between resistors $R_5$ and $R_6$ is connected to the base of a transistor $Q_{11}$. The emitters of transistors $Q_{10}$ and $Q_{11}$ are connected through resistors $R_7$ and $R_8$, respectively, to the negative supply voltage $V_{EE}$.

Similarly, inverse output circuit 52 includes a transistor $Q_{12}$ having a base connected to the collector of transistor $Q_1$, equal resistors $R_9$ and $R_{10}$ connected in parallel with the collector-emitter path of transistor $Q_{12}$, and a transistor $Q_{13}$ having a base connected to the common junction between resistors $R_9$ and $R_{10}$. The emitters of transistors $Q_{12}$ and $Q_{13}$ are connected through resistors $R_{11}$ and $R_{12}$, respectively, to the negative supply voltage $V_{EE}$.

As indicated in FIG. 5, the true outputs A, B, C and D are taken from output circuit 51 as follows. Output A is connected to the base of transistor $Q_{10}$, output B is connected to the junction of resistors $R_5$ and $R_6$ and the base of transistor $Q_{11}$, output C is connected to the emitter of transistor $Q_{10}$, and output D is connected to the emitter of transistor $Q_{11}$. Similarly, in inverse output circuit 52, output $\overline{A}$ is connected to the base of transistor $Q_{12}$, output $\overline{B}$ is connected to the common junction of resistors $R_9$ and $R_{10}$, output $\overline{C}$ is connected to the emitter of transistor $Q_{12}$, and output $\overline{D}$ is connected to the emitter of transistor $Q_{13}$.

As noted above, resistors $R_1$ and $R_2$ are sized such that $R_1 \times I_S=0.5\phi$ and $R_2 \times I_S=0.5\phi$. Thus, when transistor $Q_1$ is turned on, the voltage at the base of transistor $Q_{12}$ is equal to $-0.5\phi$, and the voltage at the base of transistor $Q_{10}$ is equal to 0 V. Conversely, when transistor $Q_1$ is turned off and transistor $Q_2$ is turned on, the voltage at the base of transistor $Q_{12}$ is equal to 0 V and the voltage at the base of transistor $Q_{10}$ is equal to $-0.5\phi$. Thus output A varies between a high state of 0 V and a low state of $-0.5\phi$. The voltage at the emitter of transistor $Q_{10}$ is $1.0\phi$ below the voltage at the base of transistor $Q_{10}$, and resistors $R_5$ and $R_6$, which are equal, act as a voltage divider which divides the voltage between the positive voltage supply and the negative emitter of transistor $Q_{10}$ by 2. Thus the voltage at output B is equal to $-0.5\phi$ in its high state and $-0.75\phi$ in its low state. The voltage at output C is double these values, namely, $-\phi$ in its high state and $-1.5\phi$ in its low state. Since output B is connected to the base of transistor $Q_{11}$ and output D is connected to the emitter of transistor $Q_{11}$, output D is one diode drop below output B. Hence output D varies between $-1.5\phi$ in its high state and $-1.75\phi$ in its low state. The high ($V_{OH}$) and low ($V_{OL}$) outputs of true output circuit 51 are summarized in Table 1.

TABLE 1

| Output | $V_{OH}$ | $V_{OL}$ |
|---|---|---|
| A | 0 | $-0.5\phi$ |
| B | $-0.5\phi$ | $-0.75\phi$ |
| C | $-\phi$ | $-1.5\phi$ |
| D | $-1.5\phi$ | $-1.75\phi$ |

By a similar process, the inverse outputs $\overline{A}$, $\overline{B}$, $\overline{C}$ and $\overline{D}$ can be determined and are shown in Table 2.

TABLE 2

| Output | $V_{OH}$ | $V_{OL}$ |
|---|---|---|
| $\overline{A}$ | 0 | $-0.5\phi$ |
| $\overline{B}$ | $-0.5\phi$ | $-0.75\phi$ |
| $\overline{C}$ | $-\phi$ | $-1.5\phi$ |
| $\overline{D}$ | $-1.5\phi$ | $-1.75\phi$ |

The differential output pairs $A/\overline{A}$, $B/\overline{B}$, $C/\overline{C}$ and $D/\overline{D}$ are connected to the corresponding inputs of an ECL circuit similar to ECL circuit 50. Thus output A is connected to the base of a transistor corresponding to transistor $Q_1$ and output $\overline{A}$ is connected to the base of a transistor corresponding to transistor $Q_2$. Similarly, the outputs $B/\overline{B}$, $C/\overline{C}$ and $D/\overline{D}$ would be connected to transistor pairs corresponding to transistors $Q_3/Q_4$, $Q_5/Q_6$, and $Q_7/Q_8$.

The voltage at the emitters of transistor pairs $Q_1/Q_2$, $Q_3/Q_4$, $Q_5/Q_6$ and $Q_7/Q_8$ is equal to a diode drop below the voltage at the base of whichever transistor in the pair is conducting. For example, when transistor $Q_1$ is conducting, its base voltage is equal to 0 V, and its emitter voltage is therefore equal to $-\phi$; when transistor $Q_2$ is conducting its base voltage is equal to 0 V and thus the voltage at its emitter remains at $-\phi$. From the above tables, it is apparent that the voltage at the emitters of transistors $Q_3$ and $Q_4$ is equal to $-1.5\phi$, the voltage at the emitters of transistors $Q_5$ and $Q_6$ is equal to $-2\phi$ and the voltage at the emitters of transistors $Q_7$ and $Q_8$ is equal to $-2.5\phi$.

Accordingly, the voltage across resistor $R_{CS}$ is equal to $-2.5\phi-(-3\phi)=0.5\phi$, and $$I_S = \frac{0.5\phi}{R_{CS}}$$

This demonstrates that the supply current $I_S$ is relatively constant since it is not effected by fluctuations in the negative supply voltage $V_{EE}$. Such variations are absorbed by the damping resistor $R_D$.

The magnitude of $I_S$ in turn determines the values of resistors $R_1$ and $R_2$. If $V_S$ represents the desired voltage swing of outputs A and $\overline{A}$:

$$V_S = \frac{R_1}{R_{CS}} 0.5\phi$$

$$V_S = \frac{R_2}{R_{CS}} 0.5\phi$$

The differential outputs of an ECL circuit according to this invention may be connected to the base terminals of a corresponding transistor pair in a similar ECL circuit. The need to translate the outputs is eliminated.

It will be understood that the ECL circuit illustrated in FIG. 5 is merely illustrative of the many and varied types of logic circuits that can be constructed using techniques well known in the art. While the ECL circuit described contains four decision-making levels with a supply voltage difference of only 3.3 V, if the supply voltage were increased, more levels could be included. For example, with a voltage difference of 5.2 V, seven decision-making levels could be included in a single ECL circuit. Moreover, one of output circuits 51 and 52 may be omitted, and single-ended inputs could be substituted for the differential inputs $A/\overline{A}$, etc., with the base of one transistor in transistor pairs $Q_1/Q_2$, etc., being tied to a reference voltage (see $V_{BB}$, $V'_{BB}$ in FIG. 3). Many additional and alternative embodiments will be apparent to those skilled in the art, all of which are intended to be included within the broad scope of this invention.

I claim:

1. An emitter-coupled logic circuit, connected between a first supply terminal and a second supply terminal, comprising:

a plurality of decision-making levels, each of said decision-making levels comprising a pair of transistors having respective emitter terminals connected together; and an output circuit connected to said decision making levels;

said output circuit comprising a first load resistor and a PN junction connected in series, and a voltage divider, an end terminal of said voltage divider being connected to a terminal of said PN junction, said PN junction being included in a first output transistor;

said output circuit further comprising a first output terminal connected to a base terminal of said first output transistor and a second output terminal connected to an intermediate terminal of said voltage divider;

2. The emitter-coupled logic circuit of claim 1 wherein said output circuit further comprises a second output transistor, said second output terminal being connected to a base terminal of said second output transistor, and a third output terminal, said third output terminal being connected to an end terminal of said voltage divider.

3. The emitter-coupled logic circuit of claim 2 wherein said output circuit further comprises a fourth output terminal, said fourth output terminal being connected to an emitter terminal of said second output transistor.

4. The emitter-coupled logic circuit of claim 3 wherein said logic circuit comprises four decision-making levels, and said first and said second supply terminals of said logic circuit are connected to a first supply voltage and a second supply voltage separated by approximately 3.3 V.

5. The emitter-coupled logic circuit of claim 3 wherein said logic circuit comprises seven decision-making levels, and said first and said second supply terminals of said logic circuit are connected to a first supply voltage and a second supply voltage separated by approximately 5.2 V.

6. The emitter-coupled logic circuit of claims 1, 2 or 3 wherein said output circuit comprises a true output circuit, said logic circuit further comprising an inverse output circuit.

7. The emitter-coupled logic circuit of claim 6 wherein one transistor in each of said transistor pairs is intended to receive a true input and the other transistor in each of said transistor pairs is intended to receive an inverse input.

8. The emitter-coupled logic circuit of claim 1 further comprising a current source and a second load resistor, said first and second load resistors being connected between one of said decision-making levels and said first supply terminal, and said current source being connected between said plurality of decision-making levels and said second supply terminal.

9. The emitter-coupled logic circuit of claim 8 wherein said current source is designed to deliver a current which provides a voltage equal to one-half of a diode drop ($\phi$) across each of said load resistors.

10. The emitter-coupled logic circuit of claim 1 wherein said first output terminal is designed to produce a voltage which varies between a high state ($V_{OH}$) equal to a higher supply voltage and a low state ($V_{OL}$) equal to said higher supply voltage less one-half of a diode drop ($\phi$).

11. The emitter-coupled logic circuit of claim 10 wherein said second output terminal is intended to produce an output voltage which varies between a high state equal to said higher supply voltage less one-half of a diode drop ($\phi$) and a low state equal to said higher supply voltage less three-quarters of a diode drop ($\phi$).

12. The emitter-coupled logic circuit of claim 2 wherein said third output terminal is intended to produce an output voltage which varies between a high state equal to a higher supply voltage less a diode drop ($\phi$) and a low state equal to said higher supply voltage less one and one-half times a diode drop ($\phi$).

13. The emitter-coupled logic circuit of claim 3 wherein said fourth output terminal is intended to produce an output voltage which varies between a high state equal to a higher supply voltage less one and one-half times a diode drop ($\phi$) and a low state equal to said higher supply voltage less one and three-quarters times a diode drop ($\phi$).

14. The emitter-coupled logic circuit of claim 1 further comprising a current source, said current source comprising a current supply resistor and a plurality of PN junctions connected serially in a conduction path, said conduction path being connected between said first supply terminal and a terminal of said current supply resistor.

15. The emitter-coupled logic circuit of claim 14 wherein said plurality of PN junctions comprise a diode and a transistor.

16. The emitter-coupled logic circuit of claim 1 wherein a collector of said first output transistor is connected to said first supply voltage.

17. An emitter-coupled logic circuit, connected between a first supply terminal and a second supply terminal, comprising:

a plurality of decision-making levels, each of said decision-making levels comprising a pair of transistors having respective emitter terminals coupled together, wherein one transistor in each of said transistor pairs receives a true input and the other transistor receives an inverse input;

a pair of load resistors connected between one of said decision-making levels and said first supply terminal;

a current source, said current source comprising a plurality of PN junctions connected serially in a conduction path; and a current supply resistor having a first terminal connected to one of said decision-making levels, said plurality of PN junctions being connected between said first supply terminal and a second terminal of said current supply resistor, said first supply terminal being connected to a first supply voltage, said second terminal of said current supply resistor being connected through a damping resistor to said second supply terminal, said second supply terminal being connected to a second supply voltage.

18. The emitter-coupled logic circuit of claim 17 wherein said plurality of PN junctions comprises a diode and a base-emitter junction of a transistor.

19. The emitter-coupled logic circuit of claim 18 wherein said plurality of PN junctions comprises a second diode.

20. The emitter-coupled logic circuit of claim 19 wherein each of said first and second diodes comprises a transistor having its collector and base shorted together.

21. An emitter-coupled logic circuit, connected between a first voltage supply and a second voltage supply, comprising:

a plurality of decision-making levels, each of said decision-making levels comprising a pair of transistors having respective emitter terminals coupled together, wherein one transistor in each of said transistor pairs receives a true input and the other transistor receives an inverse input;

a pair of load resistors connected between one of said decision-making levels and said first voltage supply; and a current source, said current source comprising a current source resistor and a damping resistor connected in series between the emitter terminals of one of said transistor pairs and said second voltage supply, said damping resistor having a terminal connected to said second voltage supply, said current source further comprising a plurality of PN junctions connected serially in a conduction path which extends between said first voltage supply and a common node between said current source resistor and said damping resistor.

* * * * *